United States Patent [19]
Yoshikawa et al.

[11] Patent Number: 5,316,739
[45] Date of Patent: May 31, 1994

[54] METHOD AND APPARATUS FOR SURFACE TREATMENT

[75] Inventors: Masato Yoshikawa, Tokyo; Yukihiro Kusano, Tokorozawa; Setsuo Akiyama, Sagamihara; Kazuo Naito, Kawasaki; Satiko Okazaki, Tokyo; Masuhiro Kogoma, Wako, all of Japan

[73] Assignees: Bridgestone Corporation; Satiko Okazaki, both of Tokyo; Masuhiro Kogoma, Wako, all of Japan

[21] Appl. No.: 932,382

[22] Filed: Aug. 19, 1992

[30] Foreign Application Priority Data

Aug. 20, 1991 [JP] Japan .................................. 3-232180
Aug. 20, 1991 [JP] Japan .................................. 3-232182
Aug. 20, 1991 [JP] Japan .................................. 3-232183
Jun. 15, 1992 [JP] Japan .................................. 4-180290
Jun. 15, 1992 [JP] Japan .................................. 4-180292

[51] Int. Cl.⁵ .......................... B01J 19/08; H05H 1/24
[52] U.S. Cl. ................................. 422/186.05; 422/186
[58] Field of Search ............... 422/186, 186.05, 186.06

[56] References Cited

U.S. PATENT DOCUMENTS

| | | | |
|---|---|---|---|
| 3,616,461 | 10/1971 | Gorin .................... | 204/312 |
| 3,671,195 | 6/1972 | Bersin .................. | 422/186.04 |
| 3,816,196 | 6/1974 | La Combe ............. | 156/8 |
| 4,200,805 | 4/1980 | Le Francois ......... | 250/531 |
| 4,243,506 | 1/1981 | Ikeda et al. .......... | 204/298 |
| 4,252,595 | 2/1981 | Yamamoto et al. .. | 156/345 |
| 4,261,806 | 4/1981 | Asai et al. ............ | 204/165 |
| 4,600,563 | 7/1986 | Diederich ............. | 422/186.29 |
| 4,664,890 | 5/1987 | Tawada et al. ....... | 422/186.05 |
| 4,711,767 | 12/1987 | Dieberich ............. | 422/186.29 |
| 4,724,508 | 2/1988 | Macy .................... | 361/225 |
| 4,909,995 | 3/1990 | Jacob ................... | 422/186.29 |
| 4,911,812 | 3/1990 | Kudo et al. .......... | 204/192.32 |
| 5,031,571 | 7/1991 | Igarishi et al. ...... | 118/723 |
| 5,126,164 | 6/1992 | Okazaki et al. ...... | 427/39 |
| 5,185,132 | 2/1993 | Horiike et al. ....... | 422/186.05 |

FOREIGN PATENT DOCUMENTS

| | | |
|---|---|---|
| 0046945 | 3/1982 | European Pat. Off. |
| 0171239 | 2/1986 | European Pat. Off. |
| 0178907 | 4/1986 | European Pat. Off. |
| 0202636 | 11/1986 | European Pat. Off. |
| 0267513 | 5/1988 | European Pat. Off. |
| 0346055 | 12/1989 | European Pat. Off. |
| 0431951 | 6/1991 | European Pat. Off. |
| 2059971 | 4/1981 | United Kingdom |
| 2164947 | 4/1986 | United Kingdom |

*Primary Examiner*—Donald P. Walsh
*Assistant Examiner*—Daniel Jenkins
*Attorney, Agent, or Firm*—Oblon, Spivak, McClelland, Maier & Neustadt

[57] ABSTRACT

Disclosed herein is a method for surface treatment which comprises subjecting an object for surface treatment to an atmospheric pressure plasma while rolling or floating said object in an insulating vessel fed with a prescribed gas and provided on the outside thereof or on both the outside and inside thereof with electrodes for voltage application and grounding, said atmospheric pressure plasma occurring upon application of a voltage to said electrodes. This method permits simple, certain, and uniform surface treatment of any objects in the form of lump or sphere. The surface treatment by the atmospheric pressure plasma does not need the apparatus to be evacuated. Therefore, it can be carried out in a simple apparatus without causing the object for surface treatment to release volatile matters.

Disclosed also herein is a method for the surface treatment of vulcanized rubber with an atmospheric pressure plasma in the presence of an oxygen-containing gas and halogen containing gases. This method is simple and permits the surface treatment of vulcanized rubber in a clean environment. The surface treatment by this method provides the vulcanized rubber with a surface having better adhesion properties than the surface treatment with a low-pressure glow plasma. Moreover, the surface treatment is limited only to a very thin surface layer, with the vulcanized rubber itself remaining intact.

46 Claims, 22 Drawing Sheets

METHOD AND APPARATUS FOR SURFACE TREATMENT

BACKGROUND OF THE INVENTION

1. Field of the Invention

The present invention relates to a method and apparatus for surface-treating any object in the form of lump, sphere, or powder with an atmospheric pressure plasma.

The present invention also relates to a method for surface-treating vulcanized rubber for its joining to other materials.

2. Description of the Prior Art

Among several known methods for surface treatment of objects is one which employs a low-pressure glow plasma. This method permits uniform surface treatment, but in its industrial application it needs a large-scale vacuum unit that produces a vacuum of 10 Torr or below. It also has a high equipment cost and running cost for continuous treatment which is greatly affected by the life of the valve. Another disadvantage is the difficulty in applying to objects made of rubber or plastics which contain a large amount of volatile material. In a reduced pressure, these volatile material evaporate and release themselves from the surface, adversely affecting the desired object, performance, and function of plasma treatment.

There is disclosed in Japanese Patent Laid-Open Nos. 15171/1990, 48626/1990, 241739/1991 and 236475/1991 a method for treating the surface of an object with a glow plasma obtained under atmospheric pressure. This method is suitable for flat objects but is not suitable for objects in the form of lump, sphere, or powder.

Surface treatment of vulcanized rubber has been a common practice where it is necessary to combine vulcanized rubber with other materials (or rubber, metal, or plastics) for the production of composite materials or it is necessary to perform pretreatment on vulcanized rubber for its finish coating. There are several known methods for this purpose.

For example, one of such known methods is used to impart adhesion properties to the surface of vulcanized rubber. It consists of highly oxidizing the surface of vulcanized rubber with a strong acid or strong oxidizing agent, thereby forming minute cracks in the entire surface. However, it suffers from drawbacks involved in using a strong acid or oxidizing agent which needs great handling precaution and seriously damages the properties of vulcanized rubber. In addition, the surface treatment by this method does not provide a sufficient adhesion strength.

There are other methods for the surface treatment of vulcanized rubber. For example, one method consists of treating vulcanized rubber with chlorine gas, and another method consists of treating vulcanized rubber with a pseudohalide compound (See Japanese Patent Publication No. 36910/1977.) These methods are designed to attack the double bonds in rubber, thereby forming Cl-groups which promote adhesion. If these methods are applied to vulcanized rubber to be combined with other materials (such as metal and resin) for the production of anti-vibration rubber, they bring about resinification of treated surface which degrades adhesion properties and heat resistance. And they bring about the yellowing of the treated surface which are serious in the finish coating of golf balls made of balata (transpolyisoprene). They deteriorate the appearance of golf balls. In addition, chlorine gas and pseudohalogen compound are dangerous to the environment.

There is another method for surface treatment. It is a low-pressure glow plasma treating method. According to this method, the surface of vulcanized rubber is treated with $O_2$ or a mixture of $O_2$ and $CF_4$ for etching oxidation and activation. This method permits uniform surface treatment, but in its industrial application it needs a large-scale vacuum unit that produces a vacuum of 10 Torr or below. It also needs a high equipment cost and running cost for continuous treatment. In addition, treatment in a reduced pressure causes the vulcanized rubber to give off oil and water which interfere with the desired performance and function.

SUMMARY OF THE INVENTION

It is an object of the present invention to provide a method and apparatus for the simple and uniform surface treatment of any objects in the form of lump, sphere, or the like.

It is another object of the present invention to provide a simple method for the surface treatment of vulcanized rubber which imparts good adhesion properties to the surface of vulcanized rubber to be joined to other materials for the production of good composite materials.

According to the present invention, the surface treatment of an object in the form of lump or sphere (which is not flat nor straight) can be accomplished by a first method and apparatus defined below.

A method for surface treatment which comprises subjecting an object for surface treatment to an atmospheric pressure plasma while rolling or floating said object in an insulating vessel fed with a prescribed gas and provided on the outside thereof with electrodes for voltage application and grounding, said atmospheric pressure plasma occurring upon application of a voltage to said electrodes.

An apparatus for surface treatment which comprises an insulating vessel in which an object for surface treatment is placed, electrodes for voltage application and grounding which are arranged on the outside of the insulating vessel, an electric source to apply a voltage to said electrodes, a means to supply a prescribed gas to said insulating vessel, and a means to roll or float said object in the insulating vessel, said electrodes generating an atmospheric pressure plasma upon application of a voltage thereto and said object placed in said insulating vessel being exposed to said atmospheric pressure plasma.

The present invention employs atmospheric pressure plasma for the surface treatment of a rolling or floating object. This permits uniform surface treatment for objects of any form. The resulting treated surface permits good adhesion of coating film or adhesive over the entire surface in the coating or bonding of rubber and plastics.

The surface treatment according to the present invention is by means of an atmospheric pressure discharge which takes place in a gaseous atmosphere at 80°–100° C. Therefore, the surface treatment can be carried out without thermal deformation even though objects are poor in heat resistance. In addition, the surface treatment under the atmospheric pressure can be performed on rubber and plastics without evaporation of volatile matters contained therein.

Another advantage of the surface treatment with the plasma is accurate temperature control in the case where objects are exposed to a high temperature. This is because the temperature of objects is affected only a little by the plasma.

According to the present invention, the surface treatment of an object in the form of lump or sphere (which is not flat nor straight) can also be accomplished by a second method and apparatus defined below.

A method for surface treatment which comprises subjecting an object for surface treatment to an atmospheric pressure plasma while rolling or floating said object in an insulating vessel fed with a prescribed gas and provided on the outside and inside thereof with electrodes for voltage application, said atmospheric pressure plasma occurring upon application of a voltage to said electrodes.

An apparatus for surface treatment which comprises an insulating vessel in which an object for surface treatment is placed, two electrodes which are arranged on the outside and inside of the insulating vessel, an electric source to apply a voltage to said electrodes, a means to supply a prescribed gas to said insulating vessel, and a means to roll or float said object in the insulating vessel, said electrodes generating an atmospheric pressure plasma upon application of a voltage thereto and said object placed in said insulating vessel being exposed to said atmospheric pressure plasma.

The second method and apparatus offer not only the same advantages as the first ones but also the following additional advantage. The electrodes arranged on both the outside and inside of the insulating vessel permit discharge to start at a very low voltage (as demonstrated in Example 6 given later).

According to the present invention, the atmospheric pressure plasma treatment permits the surface of vulcanized rubber to be treated with a gas containing oxygen and halogen. Such surface treatment needs no solvent and hence presents no possibility of environmental pollution. The surface treatment imparts much better adhesion properties to the surface of vulcanized rubber than in the case of surface treatment by the conventional method which employs a low-pressure glow plasma. Moreover, the surface treatment affects only a very thin surface layer, without any damage to the vulcanized rubber itself.

DETAILED DESCRIPTION OF THE INVENTION

Figure 1:
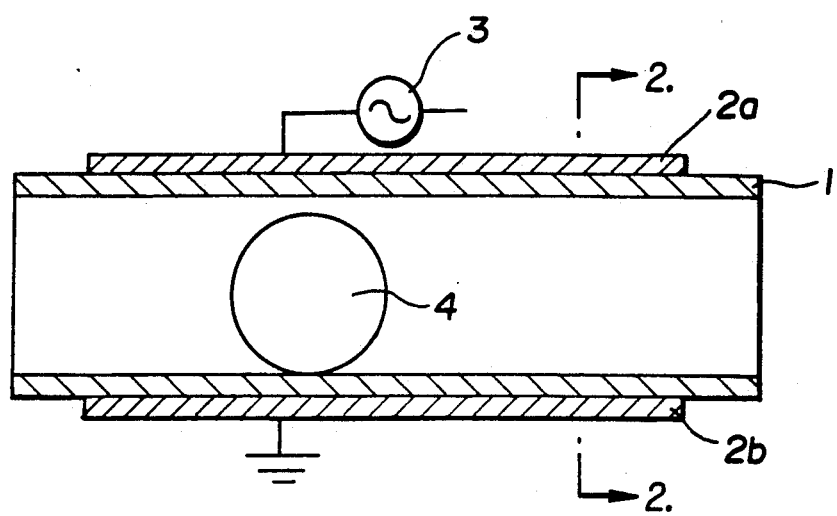
FIG. 1 is a partial longitudinal sectional view showing a surface-treating apparatus used in the present invention.

The invention will be described in more detail in the following.

The present invention is embodied in a first method for surface treatment which comprises subjecting an object for surface treatment to an atmospheric pressure plasma in an insulating vessel fed with a prescribed gas and provided on the outside thereof with electrodes for voltage application and grounding, said atmospheric pressure plasma occurring upon application of a voltage to said electrodes.

The present invention is also embodied in a second method for surface treatment which comprises subjecting an object for surface treatment to an atmospheric pressure plasma in an insulating vessel fed with a prescribed gas and provided on the outside and inside thereof with electrodes for voltage application, said atmospheric pressure plasma occurring upon application of a voltage to said electrodes.

The object for surface treatment is not specifically restricted in shape so long as it is capable of rolling or floating in the insulating vessel. It may be in the form of triangular lump, rectangular lump, polygonal lump (octahedron,, dodecahedron, icosahedron, etc.), sphere, ellipsoid, or powder. In addition, it is not specifically restricted in material. It may be made from metal, metal compound, rubber, plastics, or ceramics.

The insulating vessel used in the present invention is not specifically restricted in material, size, and shape so long as it is capable of generating a plasma and rolling or floating an object therein for surface treatment. It may be made from glass, plastics or ceramics. For the uniform surface treatment of a spherical object, it should preferably be in the form of a cylinder large enough for the object to roll therein. The wall thickness of the insulating vessel should be smaller than 10 mm, preferably smaller than 3 mm.

The electrode for voltage application is not specifically restricted in size and shape so long as it is capable of generating a plasma.

According to the present invention, the atmospheric pressure plasma for surface treatment is obtained stably by the aid of a specific gas which facilitates the generation of atmospheric pressure discharge. Examples of the gas include inert gas (such as helium, argon, and neon), non-polymerizable gas (such as nitrogen and oxygen), and organic gas. They may be used alone or in combination with one another. Of these example, helium and neon are desirable. In the case where the object of surface treatment is to improve the adhesion properties of an object, the above-mentioned list may be expanded to include nitrogen gas, oxygen gas, halogen gas and halogen compound (such as chlorine, bromine, hydrogen chloride, hydrogen bromide, bromine cyanide, tin bromide, and carbon tetrafluoride), sulfur, sulfur trioxide, hydrogen sulfide, ammonia, carbon monoxide, carbon dioxide, and hydrogen. For the stable generation of atmospheric pressure plasma, these gases should be diluted with an inert gas which facilitates the generation of atmospheric pressure discharge.

It is not necessarily essential that these gases be gaseous at normal temperature. They should be fed in a proper way which is selected according to their state (solid, liquid, or gas) at normal temperature and the temperature in the discharge region. Those which are gaseous at normal temperature or at a temperature in the discharge region may be introduced as such into the insulating vessel. Those which are liquid having a comparatively high vapor pressure may be introduced in the form of vapor or after bubbling with an inert gas. Those which are liquid having a comparatively low vapor pressure may be introduced after heating for evaporation or increasing the vapor pressure.

The pressure for generating a plasma is preferably in the range of about 200 Torr to about 3 atm, more desirably about 1 atm.

Figure 15:
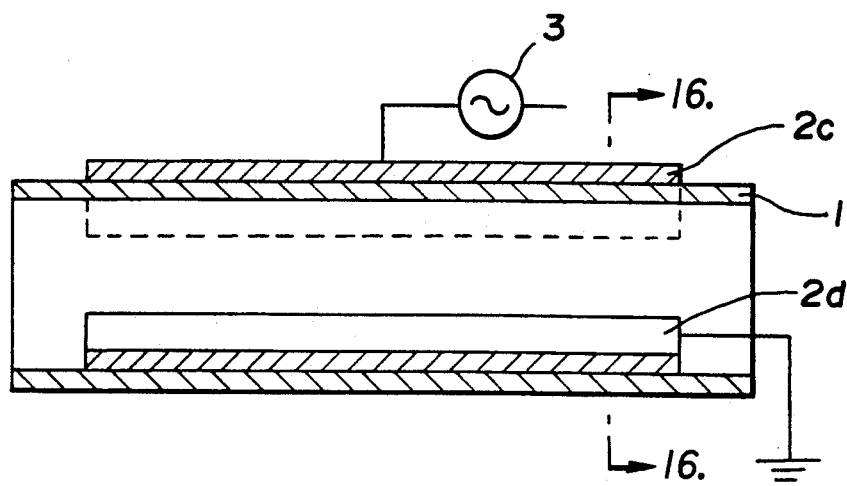
FIG. 15 is a partial longitudinal sectional view showing another surface-treating apparatus used in the present invention.

In the present invention, there are no restrictions on the method of forming a plasma in the insulating vessel. In the first method, an AC voltage should be applied to the electrodes arranged on the outside of the insulating vessel. In the second method, either direct current and alternating current may be used for voltage application, with the latter being industrially desirable. The frequency should be higher than hundreds of hertz as in the ordinary AC discharge. The application of a voltage will be explained below with reference to one example illustrated in FIGS. 15 and 16. There are shown a cylindrical insulating vessel 1, an electrode 2c arranged on the outside thereof, and an electrode 2d arranged on the inside thereof. Voltage may be applied to either the outer electrode 2c or inner electrode 2d. That is, an AC voltage may be applied to the outer electrode 2c from an AC power source 3, as shown in FIG. 15. Alternatively, an AC voltage may be applied to the inner electrode 2d. The opposite electrode may or may not be grounded. In either case, it is possible to generate stable discharge at a low voltage.

What is important in the surface treatment with an atmospheric pressure plasma according to the present invention is to roll or float an object for surface treatment. The rolling of an object may be accomplished by inclining or swinging the cylindrical insulating vessel. The floating of an object may be accomplished by injecting a treating gas into the insulating vessel.

The above method can generate an atmospheric pressure glow plasma which gives the best effect on surface treatment of a golf ball. However, in the present invention, an atmospheric pressure plasma may be generated by the other discharge methods including corona discharge, filament discharge and the like.

Figure 2:
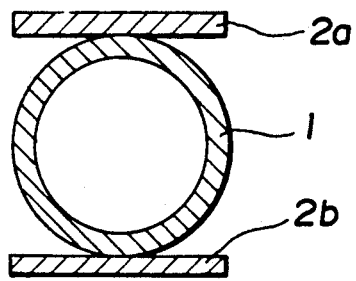
FIG. 2 is a sectional view taken along the line A—A in FIG. 1.
Figure 3:
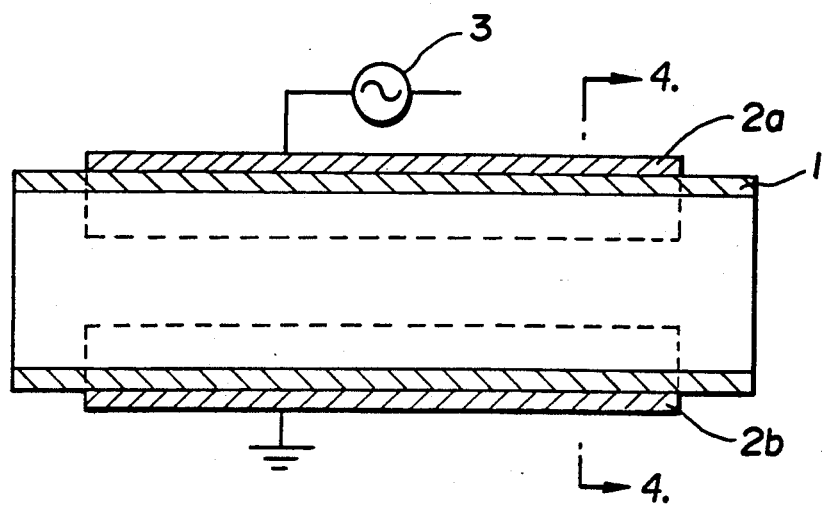
FIG. 3 is a partial longitudinal sectional view showing another surface-treating apparatus used in the present invention.
Figure 4:
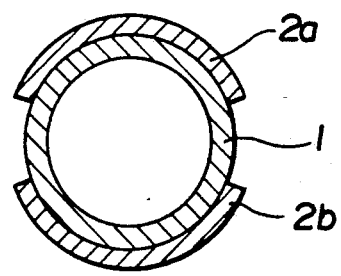
FIG. 4 is a sectional view taken along the line B—B in FIG. 3.
Figure 5:
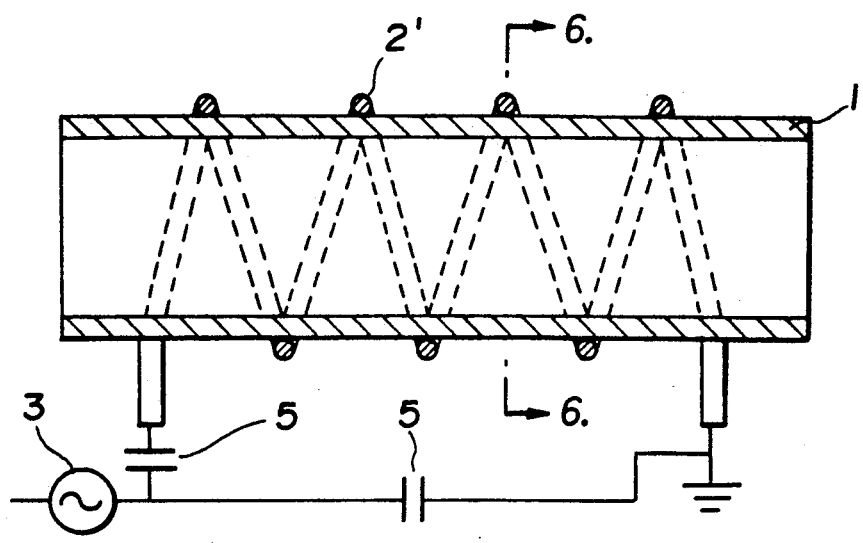
FIG. 5 is a partial longitudinal sectional view showing another surface-treating apparatus used in the present invention.
Figure 6:
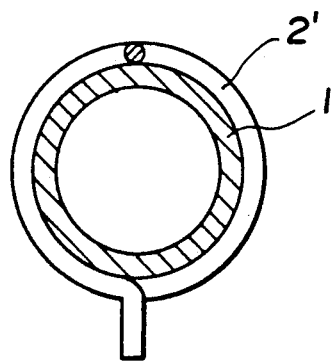
FIG. 6 is a sectional view taken along the line C—C in FIG. 5.
Figure 7:
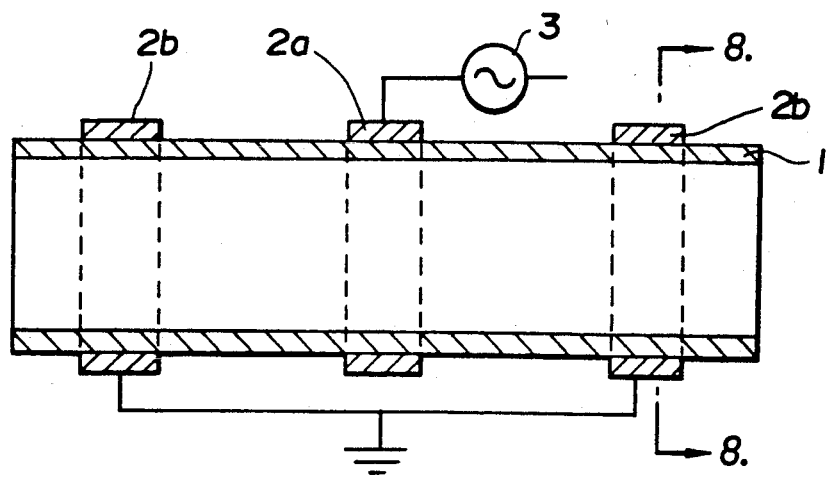
FIG. 7 is a partial longitudinal sectional view showing another surface-treating apparatus used in the present invention.
Figure 8:
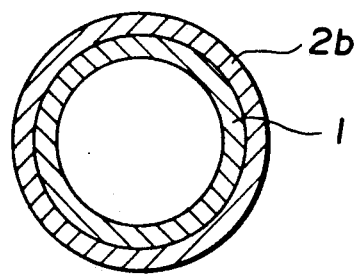
FIG. 8 is a sectional view taken along the line D—D in FIG. 7.
Figure 9:
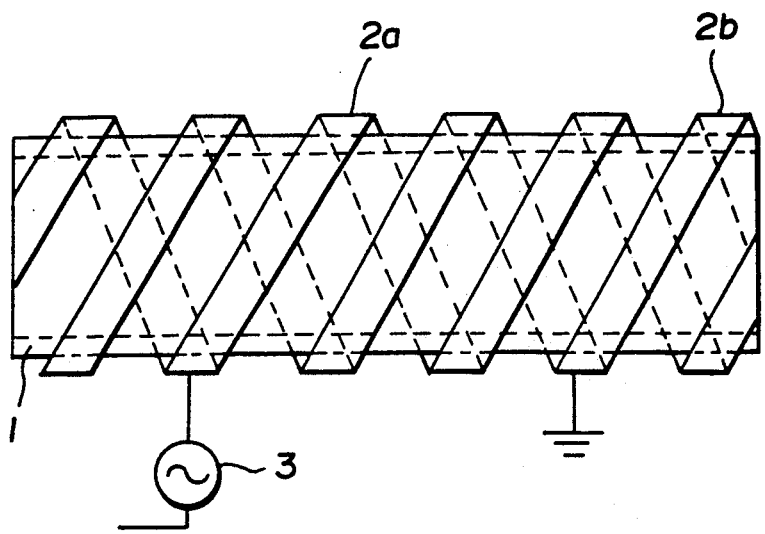
FIG. 9 is a partial longitudinal sectional view showing another surface-treating apparatus used in the present invention.

A preferred example of the apparatus used for surface treatment according to the first method of the present invention will be explained with reference to the accompanying drawings. FIGS. 1 and 2 show an apparatus for the surface treatment of an spherical object 4 with a plasma. It is made up of an insulating vessel 1 and flat parallel electrodes 2a (for voltage application) and 2b (for grounding) across which a voltage is applied by an AC power source 3. FIGS. 3 and 4 show an apparatus which is made up of an insulating vessel 1 and arched electrodes 2a and 2b arranged opposite to each other. FIGS. 5 and 6 show an apparatus which is made up of an insulating vessel 1 and an elongate electrode 2' spirally wound around the insulating vessel 1. A voltage is applied to one end of the electrode 21 through a capacitor 5, with the other end grounded. FIGS. 7 and 8 show an apparatus which is made up of an insulating vessel 1 and annular electrodes 2a (for voltage application) and 2b (for grounding) which are arranged alternately at certain intervals. FIG. 9 shows an apparatus which is made up of elongate electrodes 2a (for voltage application) and 2b (for grounding) which are spirally wound around the insulating vessel at certain intervals.

Figure 10:
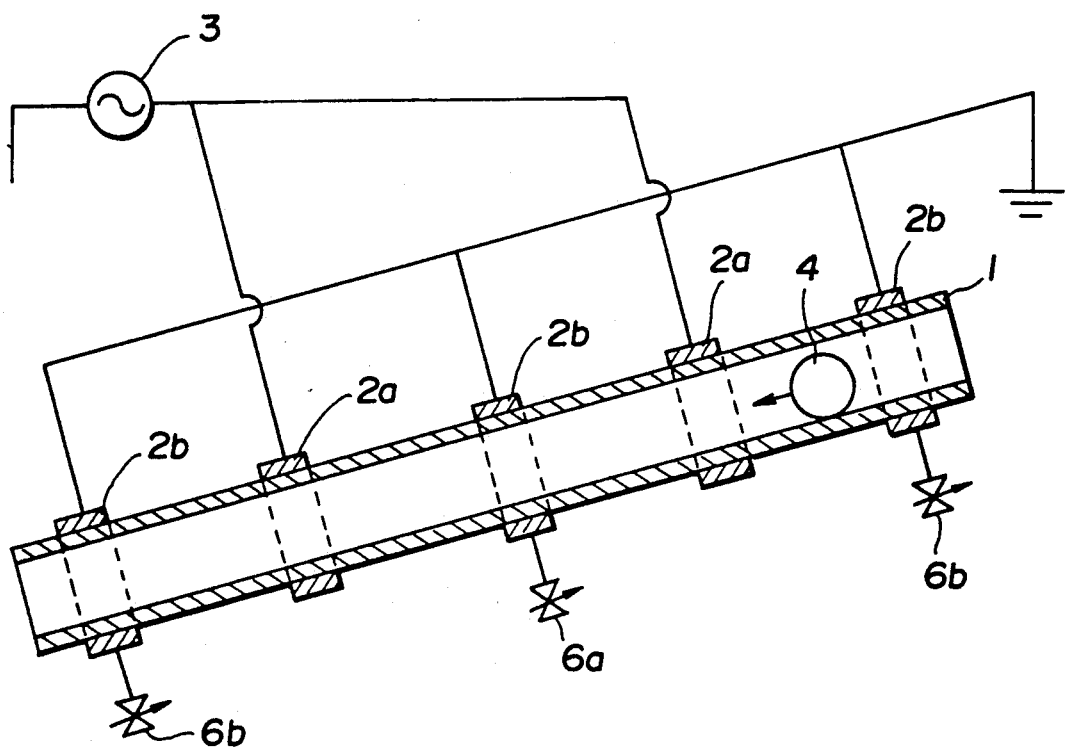
FIG. 10 is a partial longitudinal sectional view showing another surface-treating apparatus used in the present invention.
Figure 11:
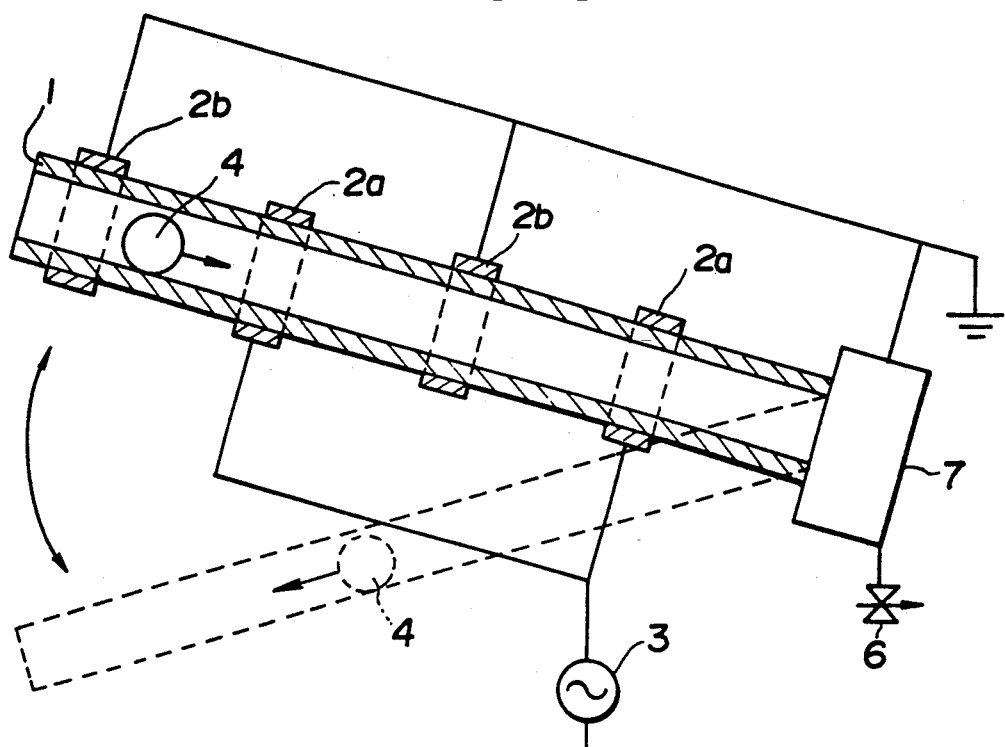
FIG. 11 is a partial longitudinal sectional view showing another surface-treating apparatus used in the present invention.

Those apparatuses shown above permit a spherical object 4 to roll in the insulating vessel 1, as shown in FIGS. 10 and 11. If the inside diameter of the insulating vessel 1 is close to the outside diameter of the spherical object 4, they permit the spherical object to roll smoothly without jams and minimize the diffusion of the treating gas (such as helium) into the atmosphere.

The apparatuses shown in FIG. 1-9 should preferably be arranged as shown in FIGS. 10-14 for spherical objects which are rolled during surface treatment. FIG. 10 shows an apparatus which is provided with the electrodes shown in FIGS. 7 and 8. It is designed such that the vessel 1 is inclined so that a spherical object 4 rolls down during surface treatment with an atmospheric pressure plasma. The insulating vessel 1 is fed with a prescribed gas from a gas supply means (not shown) through a main gas inlet 6a. There are two auxiliary gas inlets 6b and 6b at the ends of the insulating vessel 1. This arrangement of gas inlets minimizes the diffusion of the gas into the atmosphere.

FIG. 11 shows an apparatus provided with the electrodes as shown in FIGS. 7 and 8. This apparatus is designed such that one end of the insulating vessel 1 is fixed to a swinging mechanism 7 which swings so as to move the other end of the insulating vessel 1 up and down for the reciprocal movement of a spherical object in the insulating vessel during surface treatment. The treating gas is introduced into the insulating vessel 1 through a gas inlet 6 attached to the swinging mechanism 7. This arrangement minimizes the diffusion of the treating gas into the atmosphere.

Figure 12:
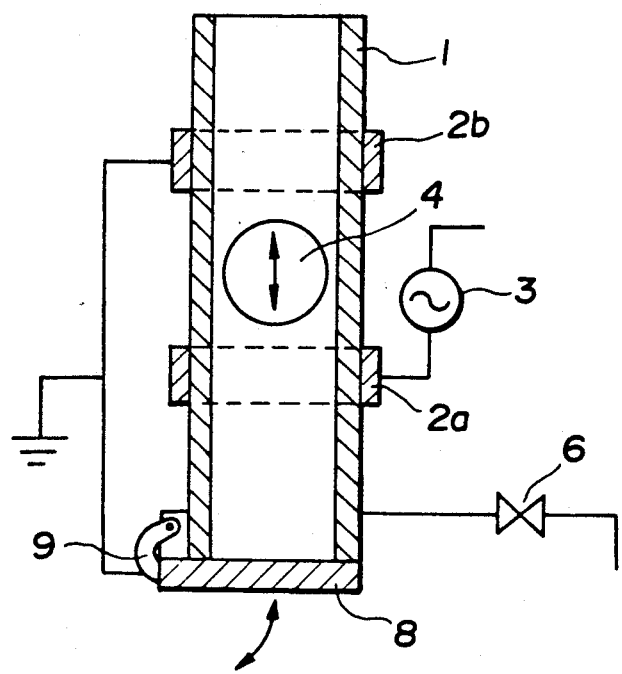
FIG. 12 is a partial longitudinal sectional view showing another surface-treating apparatus used in the present invention.

Furthermore, FIG. 12 shows an apparatus provided with the electrodes as shown in FIGS. 7 and 8. This apparatus is designed such that the insulating vessel 1 is held vertical, with the upper end thereof open and the lower end thereof provided with a hinged door 8. The hinged door 8 is opened to place a spherical object 4 in the insulating vessel 1. This treating gas is introduced into the insulating vessel 1 so as to float and roll the spherical object 4 for surface treatment. It is important that the gap between the insulating vessel 1 and the spherical object 4 be properly controlled.

In the embodiments shown in FIGS. 10-12 above, the apparatuses employ the electrodes shown in FIGS. 7 and 8; however, they are illustrative only and it is possible to use other electrodes.

FIG. 10 shows an apparatus which is designed such that the surface treatment of an object with an atmospheric pressure plasma is carried out while the object is rolling in the insulating vessel. The apparatus shown in FIG. 10 may be modified such that the movement of an object may be accomplished by means of a belt conveyor as shown in FIG. 13.

Figure 13:
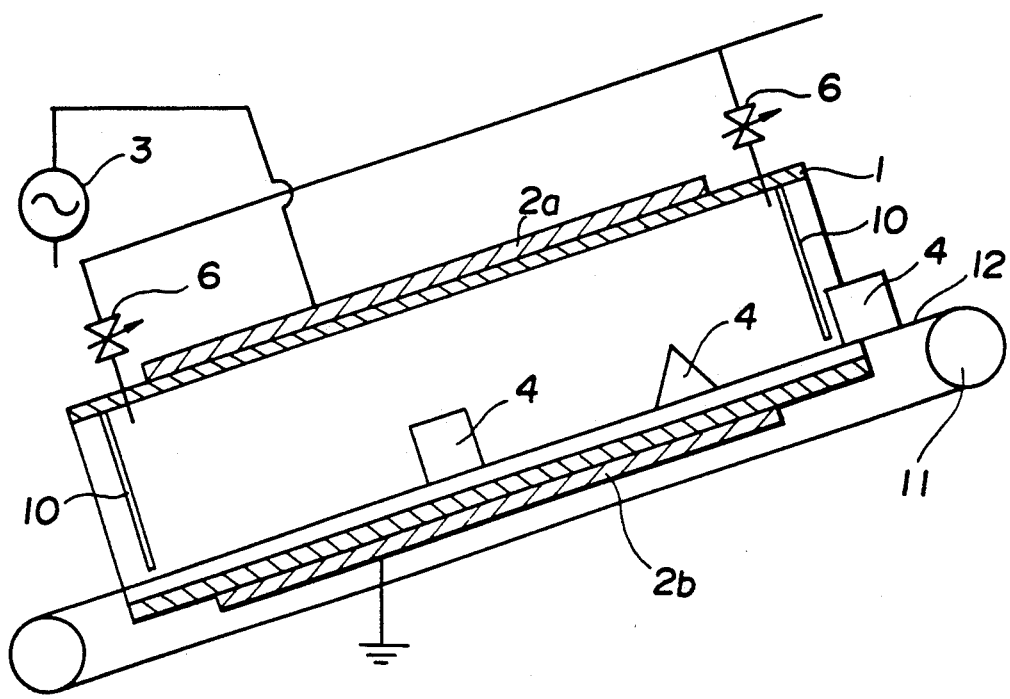
FIG. 13 is a partial longitudinal sectional view showing another surface-treating apparatus used in the present invention.

The embodiment shown in FIG. 13 is provided with the electrodes shown in FIGS. 1 and 2. The square cylindrical insulating vessel 1 is provided with gas inlets 6a and 6a and curtains 10 and 10 at the ends of the insulating vessel 1. The curtains prevent the treating gas from diffusing into the atmosphere. The objects 4 and 4 for surface treatment are placed on a belt 12 and moved at a prescribed rate by a drive mechanism 11.

Figure 14:
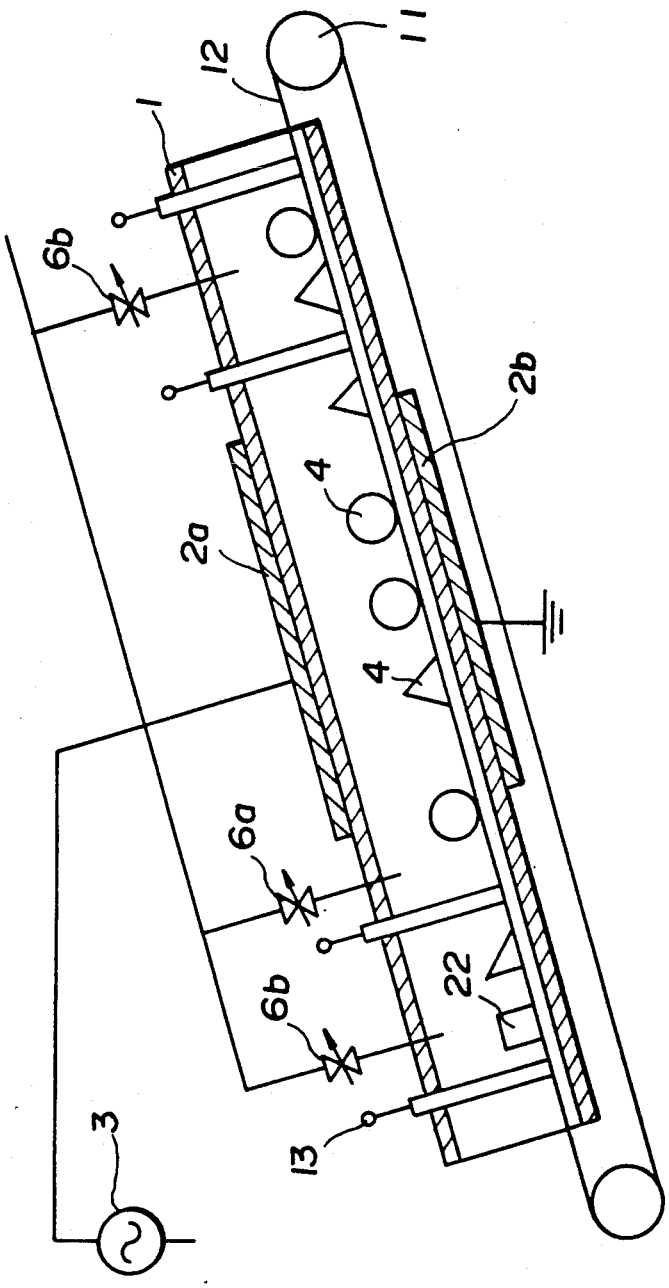
FIG. 14 is a partial longitudinal sectional view showing another surface-treating apparatus used in the present invention.

The embodiment shown in FIG. 14 is similar to that shown in FIG. 13. It is provided with gates 13 which divide the insulating vessel 1 into three compartments. The central compartment is provided with a main gas inlet 6a and the other compartments are provided with auxiliary gas inlets 6a and 6a.

A preferred example of the apparatus used for surface treatment according to the second method of the present invention will be explained with reference to FIGS. 15-40.

Figure 16:
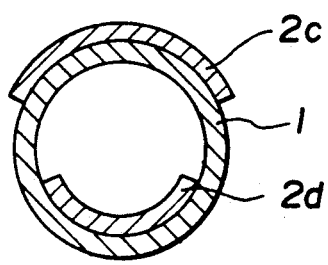
FIG. 16 is a sectional view taken along the line E—E in FIG. 15.
Figure 17:
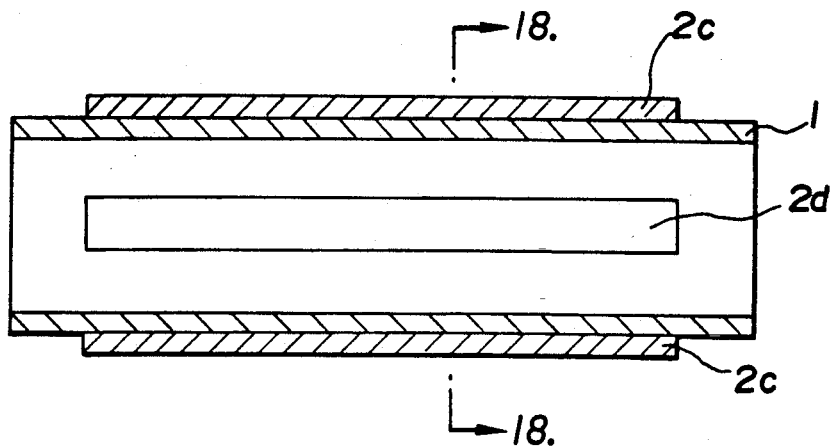
FIG. 17 is a partial longitudinal sectional view showing another surface-treating apparatus used in the present invention.
Figure 18:
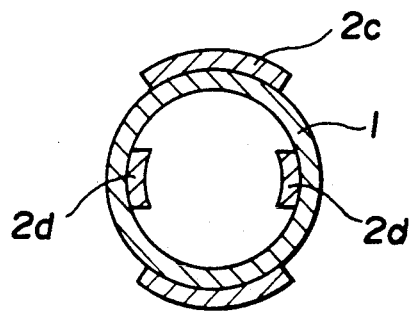
FIG. 18 is a sectional view taken along the line F—F in FIG. 17.
Figure 19:
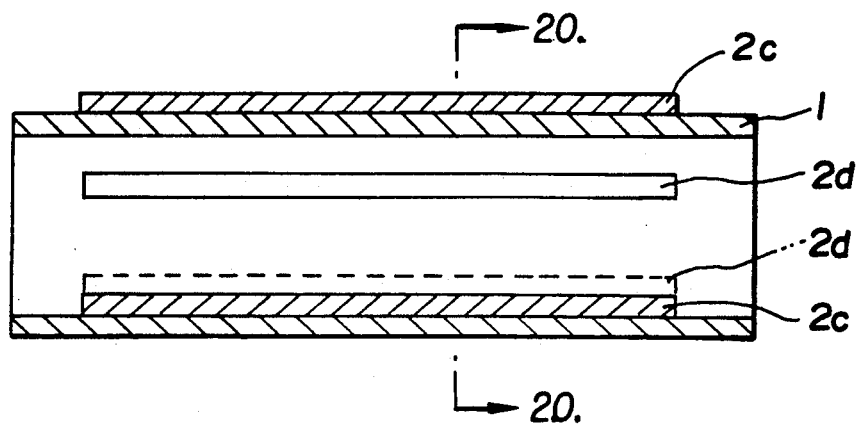
FIG. 19 is a sectional view showing another surface-treating apparatus used in the present invention.
Figure 20:
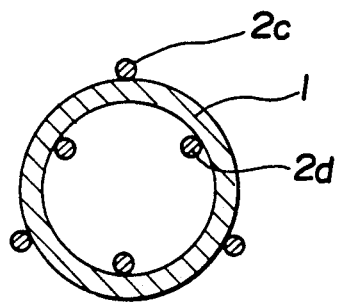
FIG. 20 is a sectional view taken along the line G—G in FIG. 19.
Figure 21:
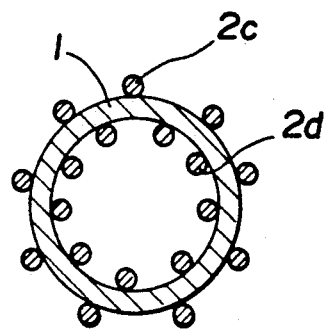
FIG. 21 is a partial longitudinal sectional view showing a surface-treating apparatus used in the present invention.
Figure 22:
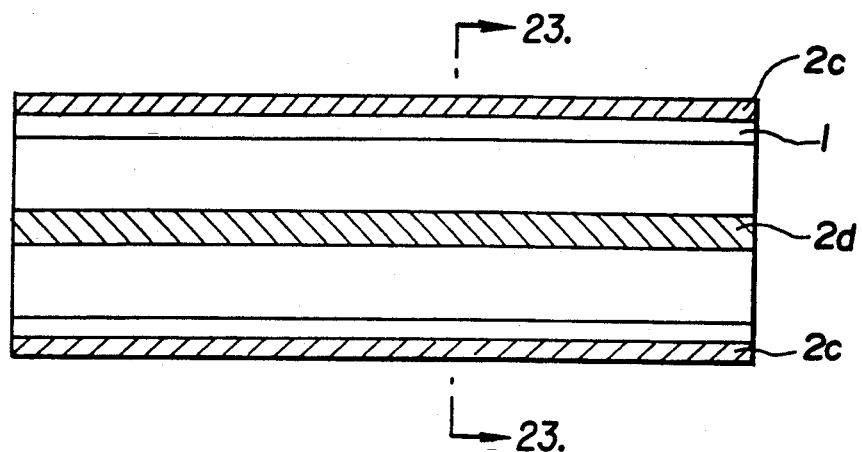
FIG. 22 is a partial longitudinal sectional view showing a surface-treating apparatus used in the present invention.
Figure 23:
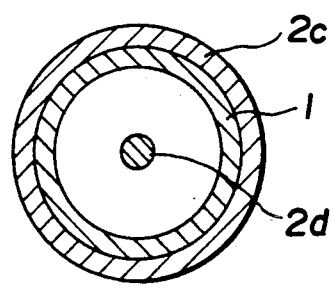
FIG. 23 is a sectional view taken along the line H—H in FIG. 22.
Figure 24:
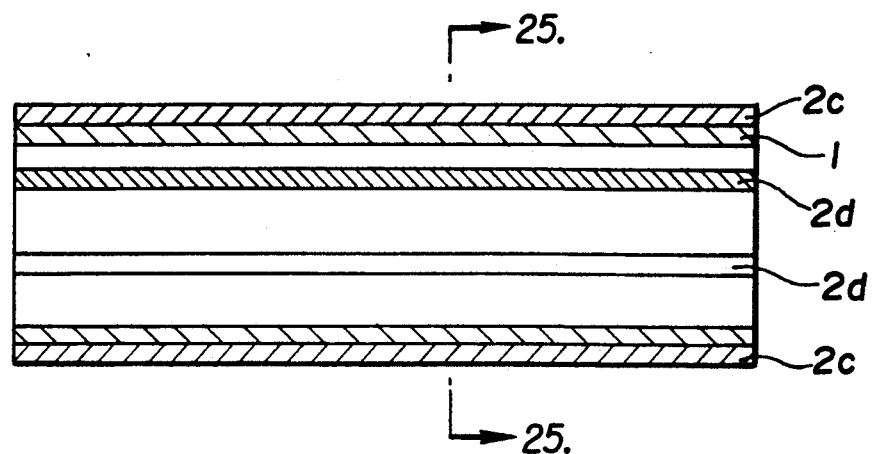
FIG. 24 is a partial longitudinal sectional view showing another surface-treating apparatus used in the present invention.
Figure 25:
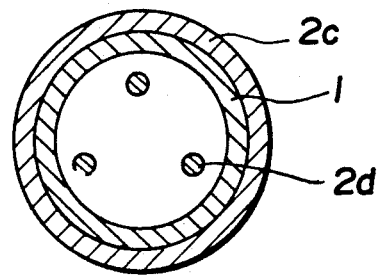
FIG. 25 is a sectional view taken along the line I—I in FIG. 24.
Figure 26:
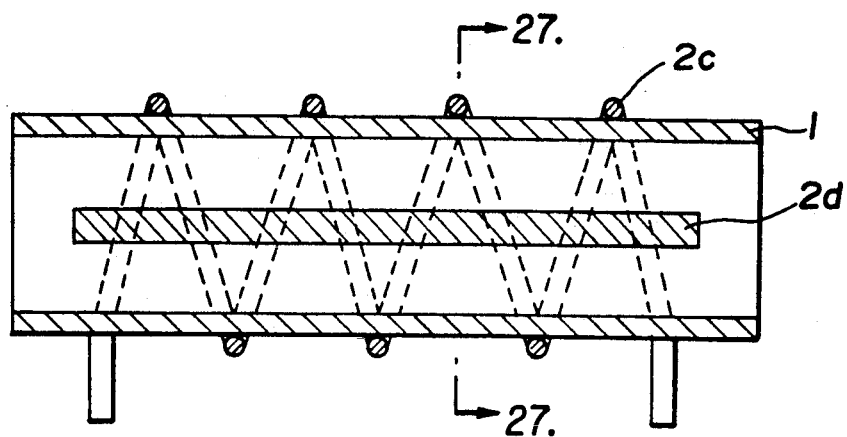
FIG. 26 is a partial longitudinal sectional view showing another surface-treating apparatus used in the present invention.
Figure 27:
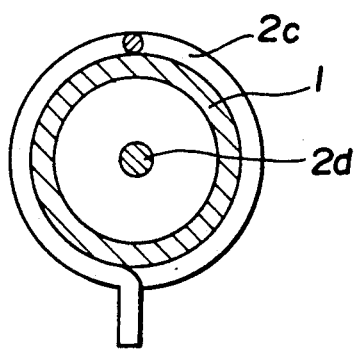
FIG. 27 is a sectional view taken along the line J—J in FIG. 26.
Figure 28:
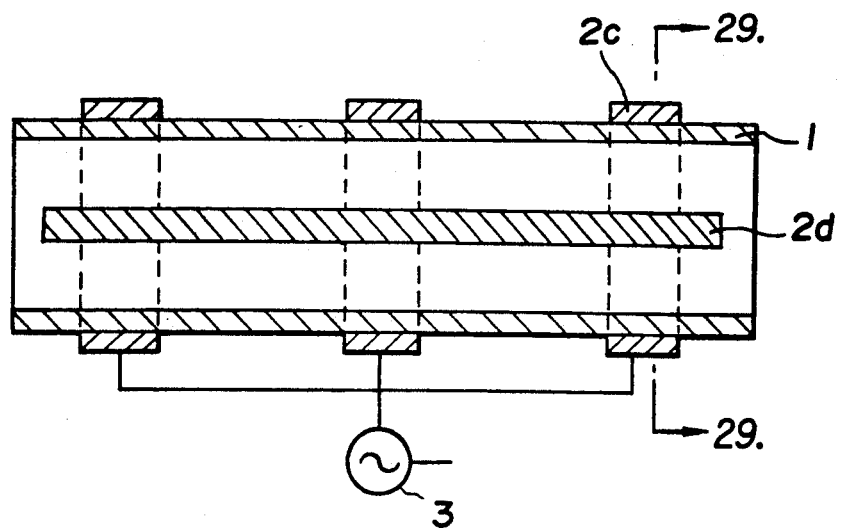
FIG. 28 is a partial longitudinal sectional view showing another surface-treating apparatus used in the present invention.
Figure 29:
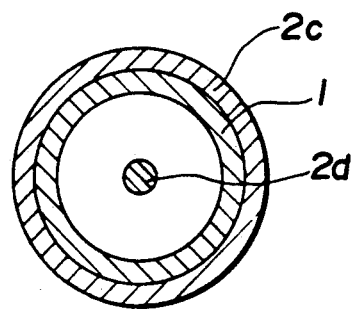
FIG. 29 is a sectional view taken along the line K—K in FIG. 28.
Figure 30:
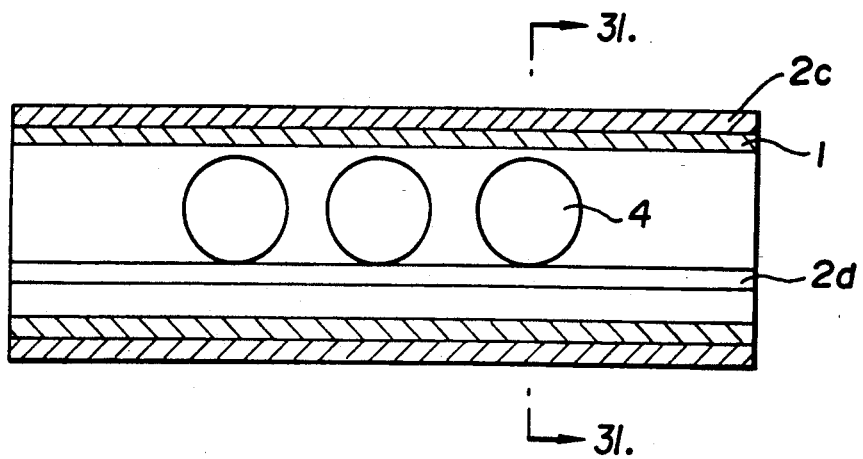
FIG. 30 is a partial longitudinal sectional view showing another surface-treating apparatus used in the present invention.
Figure 31:
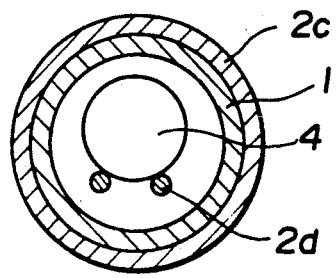
FIG. 31 is a sectional view taken along the line L—L in FIG. 30.
Figure 32:
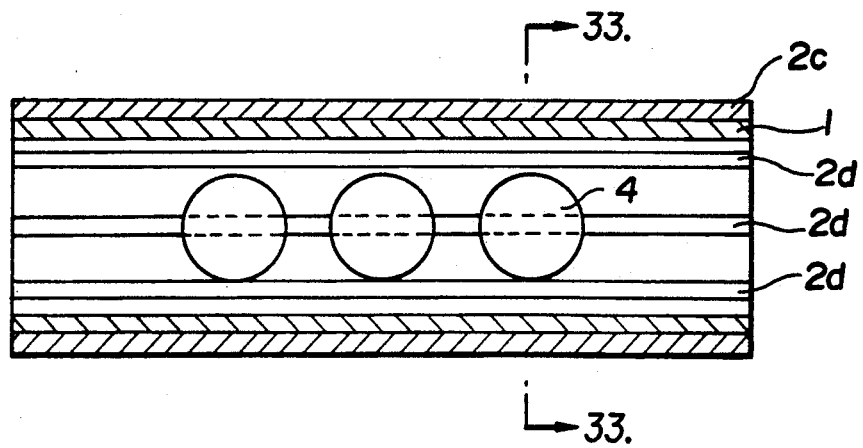
FIG. 32 is a partial longitudinal sectional view showing another surface-treating apparatus used in the present invention.
Figure 33:
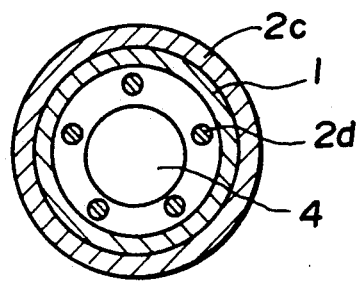
FIG. 33 is a sectional view taken along the line M—M in FIG. 32.

FIGS. 15 and 16 show an apparatus made up of a cylindrical insulating vessel 1 and an arched outer electrode 2c and an arched inner electrode 2d which are opposite to each other. A voltage is applied to the outer electrode 2c from an AC power source 3. FIGS. 17 and 18 show an apparatus made up of an insulating vessel 1, two arched outer electrodes 2c and 2c opposite to each other, and two inner arched electrodes 2d and 2d opposite to each other, with the outer and inner electrodes shifted 90° with respect to each other. FIGS. 19 and 20 show an apparatus made up of an insulating vessel 1, elongate outer electrodes 2c arranged at certain intervals, and elongate inner electrodes 2d arranged at certain intervals. FIG. 21 shows an apparatus provided with nine outer electrodes 2c and nine inner electrodes 2d. FIGS. 22 and 23 show an apparatus made up of an insulating vessel 1, a cylindrical outer electrode 2c surrounding the insulating vessel 1, and an elongate inner electrode 2d arranged in the insulating vessel 1. FIGS. 24 and 25 show an apparatus made up of an insulating vessel 1, a cylindrical outer electrode 2c surrounding the insulating vessel, and three elongate inner electrodes 2d arranged at certain intervals in the insulating vessel 1. FIGS. 26 and 27 show an apparatus made up of an insulating vessel 1, an elongate outer electrode 2c spirally wound around the insulating vessel 1 at certain intervals, and an elongate inner electrode 2d arranged in the insulating vessel 1. FIGS. 28 and 29 show an apparatus made up of an insulating vessel 1, several ring-like outer electrodes 2c arranged at certain intervals, and an elongate inner electrode 2d arranged in the insulating vessel 1. FIGS. 30 and 31 show an apparatus made up of an insulating vessel 1, a cylindrical outer electrode 2c surrounding the insulating vessel 1, and two elongate electrodes 2d and 2d arranged certain distance apart in the insulating vessel 1. The inner electrodes 2d and 2d function as a guide for the objects 4 to roll smoothly without jams. The inner electrodes 2d and 2d should preferably be positioned such that the objects 4 placed thereon are as close to the insulating vessel 1 as possible. FIGS. 32 and 33 show an apparatus (similar to that shown in FIGS. 30 and 31) which is designed such that five elongate inner electrodes 2d are arranged in a circle at certain intervals. An object 4 is placed in the space formed by these inner electrodes 2d.

Figure 34:
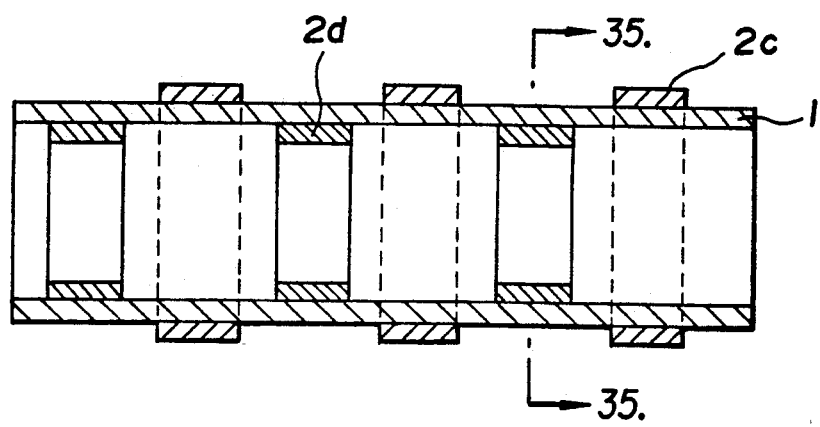
FIG. 34 is a partial longitudinal sectional view showing another surface-treating apparatus used in the present invention.
Figure 35:
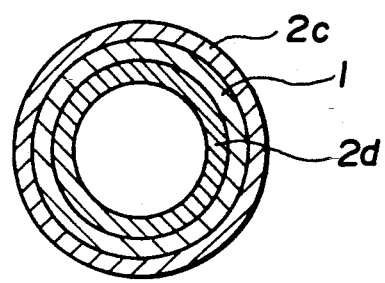
FIG. 35 is a sectional view taken along the line N—N in FIG. 34.
Figure 36:
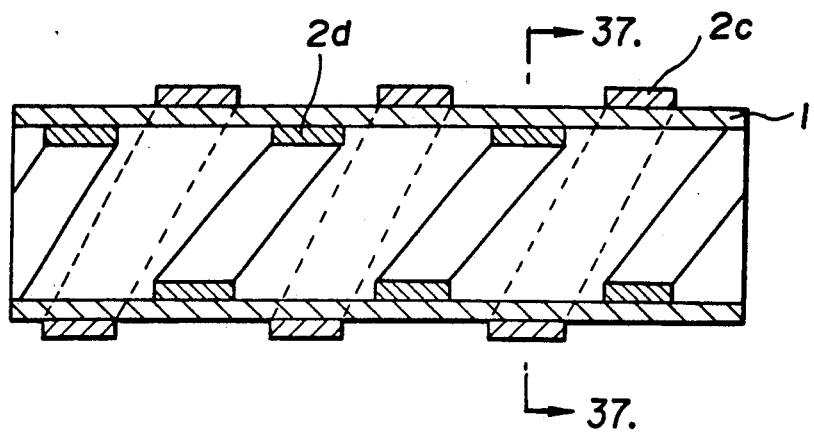
FIG. 36 is a partial longitudinal sectional view showing another surface-treating apparatus used in the present invention.
Figure 37:
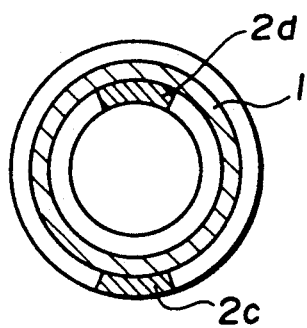
FIG. 37 is a sectional view taken along the line O—O in FIG. 36.

Those embodiments shown in FIGS. 15-33 are designed such that a voltage may be applied to either the outer electrode or the inner electrode. Those embodiments shown in FIGS. 34-37 are designed such that a voltage is applied to the outer electrode. FIGS. 34 and 35 show an apparatus made up of an insulating vessel 1 and ring-like outer electrodes 2c and ring-like inner electrodes 2d arranged at certain intervals. The inner electrodes 2d are left ungrounded. FIGS. 36 and 37 show an apparatus made up of ah insulating vessel 1 and oblique ring-like outer electrodes 2c and oblique ring-like inner electrodes 2d arranged at certain intervals. As in the case of the apparatus shown in FIGS. 34 and 35, the inner electrodes 2d are left ungrounded.

Figure 38:
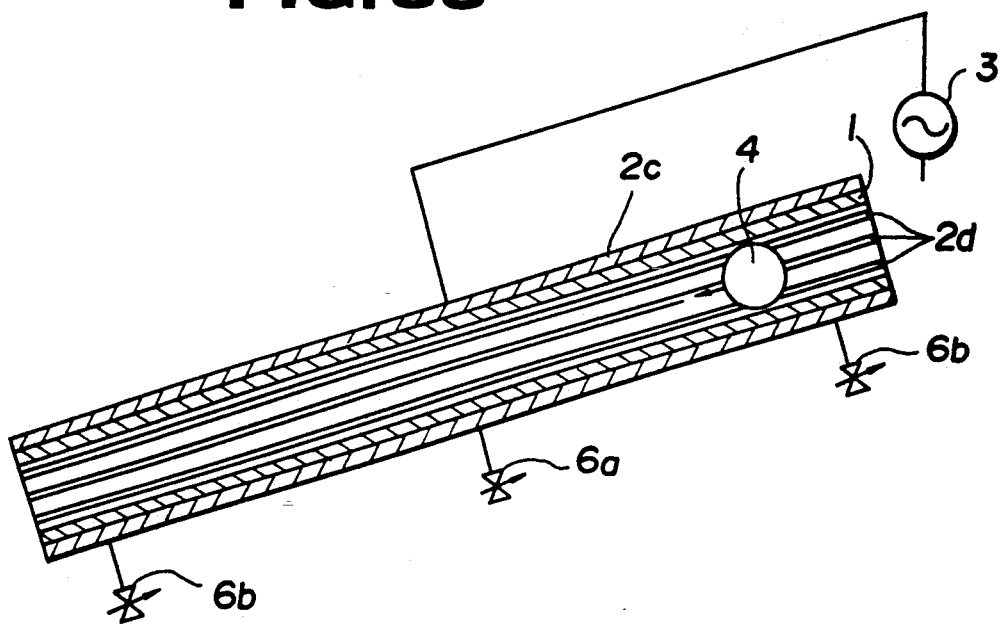
FIG. 38 is a partial longitudinal sectional view showing another surface-treating apparatus used in the present invention.
Figure 39:
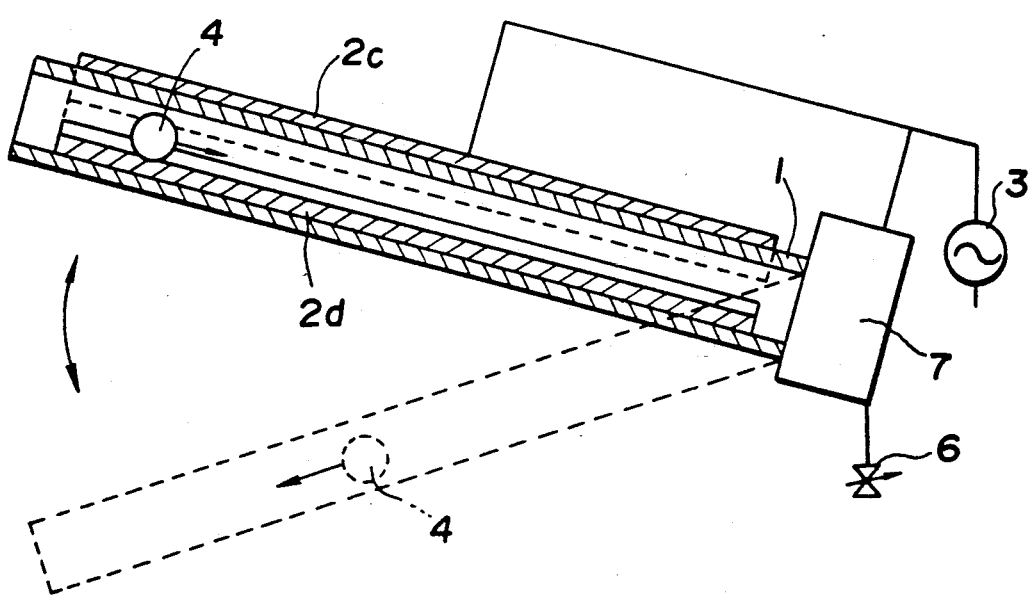
FIG. 39 is a partial longitudinal sectional view showing another surface-treating apparatus used in the present invention.

To facilitate the rolling of objects for surface treatment in the apparatuses shown in FIGS. 15-37, it is desirable to use an apparatus as shown in FIGS. 38 and 39. The apparatus shown in FIG. 38 is provided with the electrodes as shown in FIGS. 32 and 33. When in use, the apparatus permits an object 4 to roll through the insulating vessel 1 fixed inclined and undergo surface treatment by the atmospheric pressure plasma. The insulating vessel 1 is fed with a prescribed gas through a main gas inlet 6a at the center of the insulating vessel 1 from a gas supply means (not shown). There are two auxiliary gas inlets 6b and 6b at the ends of the insulating vessel 1. This arrangement of gas inlets minimizes the diffusion of the gas into the atmosphere.

FIG. 39 shows an apparatus provided with the electrodes as shown in FIGS. 15 and 16. This apparatus is designed such that one end of the insulating vessel 1 is fixed to a swinging mechanism 7 which swings so as to move the outer end of the insulating vessel 1 up and down for the reciprocal movement of an object 4. The treating gas is introduced into the insulating vessel 1 through a gas inlet 6 attached to the swinging mechanism 7. This arrangement minimizes the diffusion of the treating gas into the atmosphere.

Incidentally, although the apparatuses shown in FIGS. 38 and 39 are provided with the electrodes shown in FIGS. 32-33 and FIGS. 15-16, it is also possible to use other electrodes. In the case of an apparatus as shown in FIG. 38, it is possible to perform surface treatment while moving an object by means of a belt conveyor.

Figure 40:
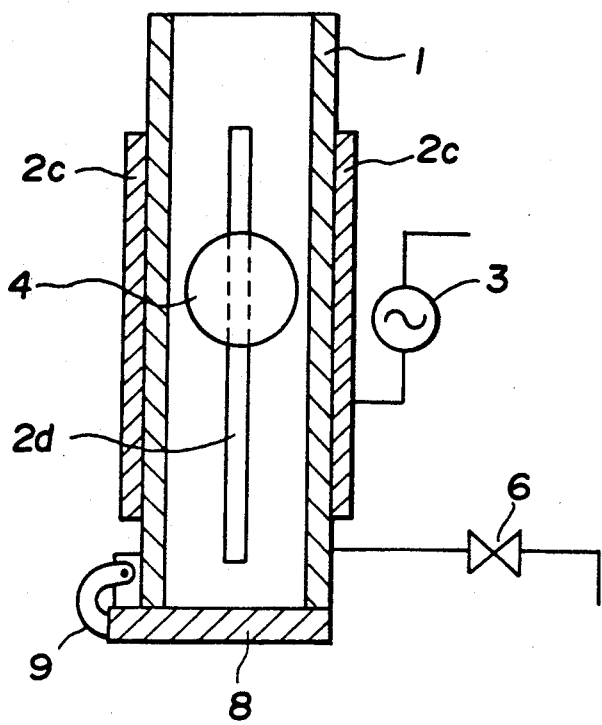
FIG. 40 is a partial longitudinal sectional view showing another surface-treating apparatus used in the present invention.

Furthermore, FIG. 40 shows an apparatus provided with the electrodes as shown in FIGS. 17 and 18. This apparatus is designed such that the insulating vessel 1 is held vertical, with the upper end thereof open and the lower end thereof provided with a hinged door 8. The hinged door 8 is opened to place an object 4 in the insulating vessel 1. The treating gas is introduced into the insulating vessel 1 through a gas inlet 6 at the bottom of the insulating vessel 1 so as to float and roll the object 4 for surface treatment. It is important that the gap between the insulating vessel 1 and the object 4 be properly controlled.

According to the method of the present invention, it is possible to carry out the surface treatment of objects in the form of lump or sphere uniformly and certainly in a simple manner. The surface treatment is by means of the atmospheric pressure plasma which does not need the treating apparatus to be evacuated. The surface treatment at atmospheric pressure requires only a simple treating apparatus and can be applied to any objects without evaporation of volatile matters contained therein.

The present invention also provides a method for surface treatment of vulcanized rubber. This method consists of treating the surface of vulcanized rubber with an atmospheric pressure plasma in the presence of a oxygen-containing gas and halogen-containing gases.

This method can be applied to any vulcanized rubber, which includes, for example, NR (natural rubber), SBR (styrene-butadiene rubber), IR (isoprene rubber), NBR (acrylonitrile butadiene rubber), EPM (ethylene propylene rubber), EPDM (ethylene propylene diene rubber), BR (butadiene rubber), IIR (butyl rubber), and CR (chloroprene rubber). The vulcanized rubber may be in any form, including plate, sheet, sphere, cylinder, column, and lump.

The surface treatment according to the present invention employs an oxygen-containing gas, which includes, for example, oxygen, water vapor, carbon dioxide, alcohols, ketones, and ethers. Of these gases, oxygen is preferable.

The surface treatment according to the present invention employs a halogen-containing gas, which includes, for example, simple substance gas (such as $F_2$, $Cl_2$, $Br_2$, and $I_2$), hydrogen halide (such as HF, HCl, HBr, and HI), fluorocarbon (such as $CF_4$, $CClF_3$, $CCl_2F_2$, $C_2F_6$, and $CBrF_3$) halogenated hydrocarbon (such as $CHClF_2$, $CHBrF_2$, $CHCl_3$, $CH_2Cl_2$, $CH_3CCl_3$, and $CCl_4$), and $SF_6$. Of these examples, fluorocarbons and halogenated hydrocarbons are desirable from the standpoint of easy handling.

The following are some examples of the preferred combination of an oxygen-containing gas and a halogen-containing gas: $O_2+CCl_2F_2$, $O_2+CClF_3$, $O_2+CHClF_2$, $O_2+CBrF_3$, $O_2+CF_4$, $O_2+CF_4+CHCl_3$, $O_2+CF_4+CH_2Cl_2$, $O_2+CF_4+CCl_4$, $O_2+CF_4+CH_3CCl_3$ Any gas which contains both oxygen and halogen may be used alone.

These reactive gases for surface treatment should preferably be diluted with an inert gas which permits the atmospheric pressure glow discharge to take place easily. Examples of the inert gas include helium, argon, neon, nitrogen, hydrogen, and organic gases. They may be used alone or in combination with one another. Of these inert gases, helium is desirable.

It is not necessarily essential that these gases be gaseous at normal temperature. They should be fed in a proper way which is selected according to their state (solid, liquid, or gas) at normal temperature and the temperature in the discharge region. Those which are gaseous at normal temperature or at a temperature in the discharge region may be introduced as such into the insulating vessel. Those which are liquid having a comparatively high vapor pressure may be introduced in the form of vapor or after bubbling with an inert gas. The liquid may be applied directly to the surface of vulcanized rubber. Those which are liquid having a comparatively low vapor pressure may be introduced after heating for evaporation or increasing the vapor pressure.

The method for generating the atmospheric pressure plasma is not specifically limited so long as it is capable of generating glow discharge in the neighborhood of atmospheric pressure. Either direct current and alternating current may be used for voltage application, with the latter being industrially easy.

It is possible to generate the AC discharge by using the ordinary inner electrodes. In this case, it is recommended that at least one of the electrodes be coated with an insulator so as to facilitate the stable generation of atmospheric pressure plasma. It is also possible to generate the AC discharge by using the outer electrodes if the treating chamber is made of insulator (such as glass). It is also possible to generate the AC discharge by using coils or waveguides. Incidentally, in the case of DC discharge, it is recommended that both electrodes (for voltage application and grounding) be not coated with an insulator so that a stable DC glow is generated by the direct flow of electrons from the electrode.

Figure 41:
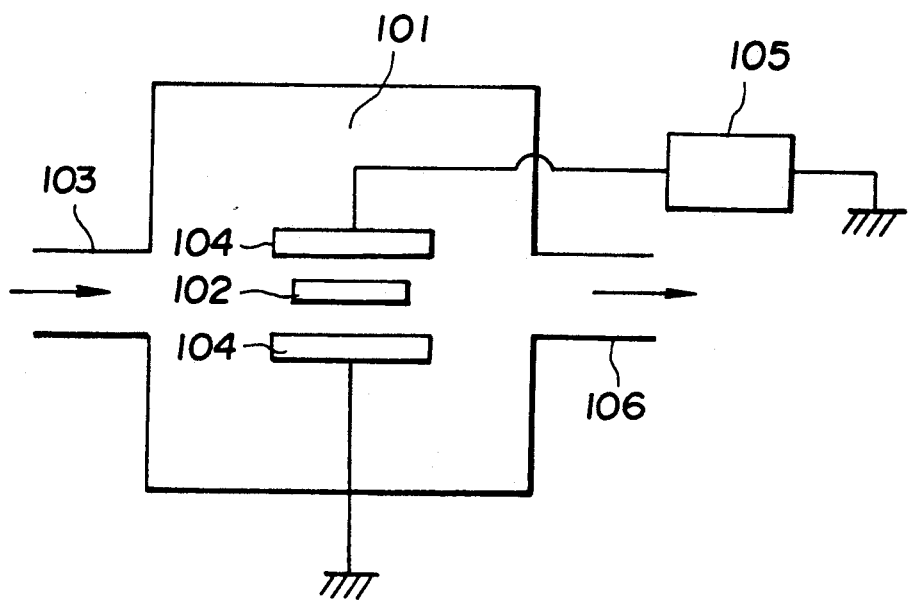
FIG. 41 is a schematic diagram showing an atmospheric pressure plasma discharge unit used in the present invention.

To practice the surface treatment according to the present invention, an apparatus as shown in FIG. 41 is used. This apparatus is made up of a treating chamber 101 and electrodes 104 and 104 arranged therein which generate the region of plasma discharge. An object for surface treatment is placed between the electrodes. The treating chamber 101 is fed with an oxygen-containing gas, a halogen-containing gas, and a diluent gas through a gas supply pipe 103. Simultaneously with the gas supply, the region of plasma discharge is generated between the electrodes 104 and 104. Incidentally, the electrodes 104 and 104 are coated with an insulator and spaced opposite to each other at a certain distance, with one of them being connected to an AC voltage 105 and the other being grounded. The surface treatment of an object 102 (vulcanized rubber) takes place in the space between the electrodes 104 and 104. The exhaust gas is discharged through a discharge pipe 106.

The surface treatment according to the present invention makes the surface of vulcanized rubber highly adhesive. Therefore, the surface-treated vulcanized rubber can be easily bonded to other materials by heating or pressing or both, which is a well-known bonding method.

Other materials to be bonded may be those of plastics, rubber, metal, or ceramics, in any form (such as plate, sheet, fiber, and lump).

The bonding of the surface-treated vulcanized rubber to other materials is facilitated by the aid of an adhesive, such as silane coupling agent, aminosilane coupling agent, epoxy adhesive, urethane adhesive, phenol adhesive, acrylic adhesive, and rubber adhesive. A proper adhesive should be selected according to the kind and surface state of the adherents and the method of bonding. No adhesives may be necessary under certain circumstances.

The surface-treating method of the present invention may be applicable to the production of a composite material of vulcanized rubber, especially to the production of golf balls, anti-vibration rubber, and reclaimed tires.

The present invention can be practiced in a simple manner for the surface treatment of vulcanized rubber in a clean environment. After surface treatment, the vulcanized rubber has a much better adhesive surface than that treated with a low-pressure glow plasma. The surface treatment affects only a very thin surface layer, without deteriorating the physical properties of the vulcanized rubber.

EXAMPLE

The invention will be described in more detail with reference to the following examples, which are not intended to restrict the scope of the invention.

EXAMPLE 1

Using an apparatus as shown in FIG. 10, surface treatment was performed on a spherical object of polypropylene resin (40 mm in diameter). The glass insulating vessel 1 (1500 mm long and 45 mm in inside diameter) inclined 25° was filled with helium gas containing 1% oxygen introduced through the gas inlet 6a. The insulating vessel 1 was further supplied with helium gas containing 1% oxygen through the gas inlets 6b located at both ends thereof, so that the helium gas leaks slightly from the open ends which serve as the entrance and exit of the object. An AC voltage (4 kV, 5 kHz) was applied across the electrodes 2a and 2b so as to produce an atmospheric pressure plasma in the vessel 1. The spherical object of polypropylene resin 4 was allowed to roll through the vessel 1 from one open end to the other for the surface treatment. For comparison, the same procedure as mentioned above was repeated except that the vessel 1 was kept horizontal so that the object 4 remained at rest at the center of the vessel 1. Three samples, one rolled during surface treatment, one kept at rest during surface treatment, and one not surface-treated, were tested for surface properties by measuring the contact angle of water at different positions. The results are shown in Table 1.

TABLE 1

|  | Rolled | Not rolled | Not treated |
| --- | --- | --- | --- |
| Upper part | 35° | 39° | 110° |
| Front part | 36° | 46° | 109° |
| Rear part | 35° | 45° | 112° |
| Left part | 38° | 36° | 110° |
| Right part | 40° | 38° | 110° |
| Lower part | 38° | 110° | 112° |
| Average | 37° | 52.3° | 110.5° |

It is noted from Table 11 that the object undergoes uniform surface treatment when it is rolled but the object does not when it is not rolled.

EXAMPLE 2

The same procedure as in Example 1 was repeated except that helium was introduced through the gas inlets 6a and 6b and the object was replaced by a two-piece solid golf ball (43 mm in diameter) having a covering layer of thermoplastic ionomer resin in which dimples are formed.

After surface treatment, the golf ball was coated with a paint, followed by drying. The adhesion of the coating film was evaluated by cross-hatch test and repeated ball impact test. The results are shown in Table 2. For comparison, the same procedure as mentioned above was repeated except that the surface coating was not performed. The results are also shown in Table 2.

The cross-hatch test consists of cutting the coating film into small pieces in mutually perpendicular directions, applying a piece of adhesive cellophane tape over the cut coating film, rapidly pulling off the tape, and counting the number of pieces removed.

The repeated impact test consists of subjecting the finished golf ball to impact repeatedly and visually examining the coating film for peeling from the golf ball.

TABLE 2

|  | Treated ball (Example) | Untreated ball (Comparative Example) |
|---|---|---|
| Cross-hatch test | None peeled out of 10. | 9 pieces peeled out of 10. |
| Repeated impact test | No peeling after 100 repetitions. | Peeling after 20 repetitions. |

EXAMPLE 3

The same procedure as in Example 1 was repeated for the surface treatment of a golf ball except that the electrode was replaced by the one shown in FIGS. 5 and 6 and a high-frequency voltage (13.56 MHz, 100W) was applied across the electrodes. The results were identical with those shown in Table 2.

EXAMPLE 4

Using an apparatus shown in FIG. 11, the surface treatment and coating of golf balls were carried out under the same conditions as in Example 2 except that the vessel 1 was swung 6 times per minute, with the maximum slope being 30°. The results were identical with those shown in Table 1.

EXAMPLE 5

Using an apparatus shown in FIG. 12, the surface treatment and coating of golf balls were carried out under the same conditions as in Example 2 except that helium gas was injected into the vessel 1 through the inlet 6 so that the golf ball 4 floated in the vessel 1. The results were identical with those shown in Table 2.

EXAMPLE 6

Using an electrode as shown in FIGS. 22 and 23 or an electrode as shown in FIGS. 3 and 4, discharging was carried out under the following conditions to compare their discharge starting voltage. The results are shown in Table 3.

Dimensions of the electrodes as shown in FIGS. 22 and 23

Insulating vessel: glass, 1500 mm long, 50 mm in outside diameter, 45 mm in inside diameter
Outer electrode: stainless steel, 240 mm long
Inner electrode: stainless steel, 240 mm long, 6 mm in diameter
AC frequency: 5 kHz Dimensions of the electrodes as shown in FIGS. 3 and 4

Insulating vessel: the same as above
Two outer electrodes: stainless steel, 240 mm long, with a minimum distance of 7 mm between electrodes
AC frequency: 5 kHz

TABLE 3

| Electrode and mode | | | Discharge start voltage (V) |
|---|---|---|---|
| | Outer electrode | Inner electrode | |
| Electrode as shown in FIGS. 22 and 23. | AC applied | Grounded | 1300 |
| | AC applied | Not grounded | 1300 |
| | Grounded | AC applied | 1100 |
| | Not grounded | AC applied | 1100 |
| Electrode as shown in FIGS. 3 and 4. | | | 2450 |

It is noted from Table 3 that it is possible to lower the discharge start voltage if the electrodes are arranged on both outside and inside of the insulating vessel. It is also noted that the discharge start voltage is slightly higher when an AC voltage is applied to the outer electrode than when an AC voltage is applied to the inner electrode. Nevertheless, it is still lower than in the case where the two electrodes are all arranged on the outside. In addition, it is noted that the discharge was stable regardless of grounding.

EXAMPLE 7

Using an apparatus as shown in FIG. 38, surface treatment was performed on a two-piece solid golf ball (43 mm in diameter) having a covering layer of thermoplastic ionomer resin in which dimples are formed. The glass insulating vessel 1 (1500 mm long and 45 mm in inside diameter) inclined 25° was filled with helium gas introduced through the gas inlet 6a. The insulating vessel 1 was further supplied with helium gas through the gas inlets 6b located at both ends thereof, so that the helium gas leaks slightly from the open ends which serve as the entrance and exit of the golf ball. An AC voltage (4 kV, 5 kHz) was applied across the electrodes 2c and 2d so as to produce an atmospheric pressure plasma in the vessel 1. A golf ball 4 was allowed to roll slowly through the vessel 1 from one open end to the other over five minutes during which the surface coating was accomplished.

After surface treatment, the golf ball was coated with a clear polyurethane paint, followed by drying. The adhesion of the coating film was evaluated by cross-hatch test and repeated ball impact test. The results are shown in Table 4.

For comparison, the same procedure as mentioned above was repeated except that the surface coating was not performed. The results are also shown in Table 4.

The cross-hatch test consists of cutting the coating film into small pieces in mutually perpendicular directions, applying a piece of adhesive cellophane tape over the cut coating film, rapidly pulling off the tape, and counting the number of pieces removed.

The repeated impact test consists of subjecting the finished golf ball to impact repeatedly and visually examining the coating film for peeling from the golf ball.

TABLE 4

|  | Treated ball (Example) | Untreated ball (Comparative Example) |
|---|---|---|
| Cross-hatch test | None peeled out of 10. | 9 pieces peeled out of 10. |
| Repeated impact test | No peeling after 100 repetitions. | Peeling after 20 repetitions. |

EXAMPLE 8

The same procedure as in Example 6 was repeated except that the electrode was replaced by the one shown in FIGS. 17 and 18 and a high-frequency voltage (13.56 MHz, 100W) was applied across the electrodes. The results were identical with those shown in Table 4.

EXAMPLE 9

Using an apparatus shown in FIG. 39, the surface treatment and coating of golf balls were carried out under the same conditions as in Example 7. The vessel 1 was swung 6 times per minute, with the maximum slope being 30°. The results were identical with those shown in Table 4.

EXAMPLES 10-23 and COMPARATIVE EXAMPLES 1-12

Using an apparatus for atmospheric pressure plasma discharge shown in FIG. 41, surface treatment was performed under the conditions shown in Table 5 on vulcanized rubber prepared from a rubber compound specified below. After surface treatment, the vulcanized rubber was tested for physical properties (Examples 10-23). For comparison, the same experiment as above was performed on a sample of vulcanized rubber without surface treatment (Comparative Example 1), a sample of vulcanized rubber treated with a pseudohalogen compound (Comparative Example 2), and samples of vulcanized rubber treated with a low-pressure glow plasma (Comparative Examples 3-12). The results are shown in Table 5.

Experiment 1

|  | pbw |
|---|---|
| Transpolyisoprene | 30 |
| SBR | 50 |
| (#1502, made by Japan Synthetic Rubber) |  |
| NR | 20 |
| Sulfur | 1 |
| Zinc oxide | 5 |
| Nocrac NS-6 | 1 |
| (made by Ouchi Shinko Kagaku Kogyo) |  |

Figure 42:
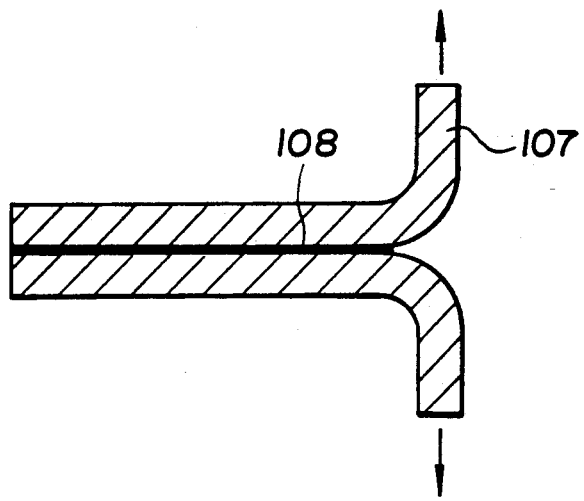
FIG. 42 is a diagram illustrating the T-peel test used in Examples and Comparative Examples.

A rubber compound specified above was vulcanized, and the vulcanized rubber was made into test pieces measuring 10×60×3 mm. The test pieces (in Examples 10-18 and Comparative Examples 1-7) underwent surface treatment under the conditions shown in Table 5. The treated surface was coated with a urethane adhesive, and two test pieces were bonded together, with the coating inside. The bonded test piece underwent T-peel test as shown in FIG. 42 to measure the bond strength. In FIG. 42, the reference numeral 107 represents the vulcanized rubber test piece and the reference numeral 108 represents the urethane adhesive.

Experiment 2

Figure 43:
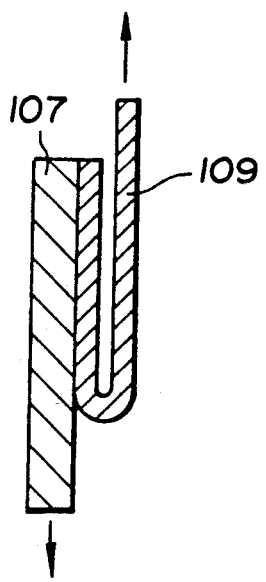
FIG. 43 is a diagram illustrating the 180° peel test used in Examples and Comparative Examples.

Vulcanized rubbers (in Examples 11-18) underwent the surface treatment under the same conditions as in Experiment 1. The treated surface of the test piece was coated with a urethane adhesive and bonded to a piece of polyester nonwoven fabric. The resulting sample underwent 180° peel test as shown in FIG. 43 to measure the bond strength. In FIG. 43, the reference numeral 109 represents the nonwoven fabric.

Experiment 3

|  | pbw |
|---|---|
| SBR | 50 |
| (#1502, made by Japan Synthetic Rubber) |  |
| NR | 50 |
| Carbon black | 60 |
| Sulfur | 2 |
| Zinc oxide | 5 |
| Antioxidant (*1) | 1 |
| Accelerator (*2) | 1 |

(*1) N,N'-diphenyl-p-phenylenediamine (DPPD)
(*2) N-oxydiethylene-2-benzothiazole (NOBS)

A rubber compound specified above was vulcanized, and the vulcanized rubber was made into test pieces measuring 34×75×5 mm. The test pieces (in Examples 12-18 and Comparative Examples 1, 2, 4-7) underwent surface treatment under the conditions shown in Table 5. The treated surface was coated with a phenol adhesive, and two test pieces were bonded together, with the coating inside, under pressure at 150° C. for 30 minutes. The bonded test piece underwent T-peel test as shown in FIG. 42 to measure the bond strength.

Experiment 4

|  | pbw |
|---|---|
| NBR | 100 |
| (N2305, made by Japan Synthetic Rubber) |  |
| Carbon black | 60 |
| Sulfur | 2 |
| Zinc oxide | 5 |
| Antioxidant (*3) | 1 |
| Accelerator (*4) | 1 |
| Mineral oil | 2 |

(*3) N-phenyl-N'-isopropyl-p-phenylenediamine (NOCRAC 810-NA)
(*4) Tetramethylthiuram monosulfide (TMTM)

A rubber compound specified above was vulcanized at 150° C. for 20 minutes, and the vulcanized rubber was made into test pieces measuring 34×75×5 mm. The test pieces (in Examples 17-23 and Comparative Examples 10-14) underwent surface treatment under the conditions shown in Table 5. The treated surface was coated with a phenol adhesive, followed by heating in an oven at 150° C. for 30 minutes. Using a resin injection machine, glass fiber-filled nylon (50%) was injection molded on the phenolic resin adhesive. The resulting sample underwent the 180° peel test as shown in FIG. 43 and the area (in terms of %) in which the rubber ruptured was measured.

TABLE 5

| Example | Treatment | Pressure (Torr) | Reactive gas | Diluent gas | Treating time (min.) | Bond strength (kgf/cm) Experiment 1 | Experiment 2 | Experiment 3 | Rubber rupture Experiment 4 |
|---|---|---|---|---|---|---|---|---|---|
| 10 | Atmospheric pressure plasma treatment | 760 | O$_2$, SF$_6$ | He | 5 | 2.7 | — | — | — |
| 11 |  | 760 | O$_2$, CF$_4$ | He | 5 | 4.7 | 2.0 | — | — |
| 12 |  | 760 | O$_2$, CClF$_3$ | He | 5 | 8.6 | 6.9 | 12.5 | — |
| 13 |  | 760 | O$_2$, CHClF$_2$ | He | 5 | 8.0 | 7.2 | 10.9 | — |
| 14 |  | 760 | O$_2$, CCl$_2$F$_2$ | He | 5 | 9.4 | 7.6 | 10.6 | — |
| 15 |  | 760 | O$_2$, CF$_4$, CHCl$_3$ | He | 5 | 3.6 | 3.0 | 9.4 | — |
| 16 |  | 760 | O$_2$, CF$_4$, CH$_2$Cl$_2$ | He | 5 | 8.7 | 7.1 | 6.8 | — |
| 17 |  | 760 | O$_2$, CF$_4$, CH$_3$CCl$_3$ | He | 5 | 8.1 | 7.0 | 7.6 | — |
| 18 |  | 760 | O$_2$, CBrF$_3$ | He | 5 | 7.6 | 6.1 | 9.4 | — |
| 19 |  | 760 | O$_2$, CF$_4$ | He | 0.5 | — | — | — | 100 |
| 20 |  | 760 | O$_2$, CF$_4$ | He | 1 | — | — | — | 100 |
| 21 |  | 760 | O$_2$, CF$_4$ | He | 2 | — | — | — | 100 |

TABLE 5-continued

| 22 | | 760 | O$_2$, CF$_4$ | He | 5 | — | — | — | 100 |
| 23 | | 760 | O$_2$, CF$_4$ | He | 10 | — | — | — | 100 |

| Comparative Example | Treatment | Pressure (Torr) | Reactive gas | Diluent gas | Treating time (min.) | Bond strength (kgf/cm) | | | Rubber rupture (%) |
| --- | --- | --- | --- | --- | --- | --- | --- | --- | --- |
| | | | | | | Experiment 1 | Experiment 2 | Experiment 3 | Experiment 4 |
| 1 | None | — | — | — | — | 0.0 | 0.0 | 0.0 | — |
| 2 | Pseudo-halogen compound | — | — | — | — | 7.8 | 6.4 | 9.1 | — |
| 3 | Low-pressure glow plasma treatment | 1.0 | O$_2$, SF$_6$ | — | 5 | 1.3 | — | — | — |
| 4 | | 1.0 | O$_2$, SF$_4$ | — | 5 | 0.6 | — | 2.0 | — |
| 5 | | 1.0 | O$_2$, CClF$_3$ | — | 5 | 1.8 | — | 1.2 | — |
| 6 | | 1.0 | O$_2$, CHClF$_2$ | — | 5 | 2.6 | — | 1.0 | — |
| 7 | | 1.0 | O$_2$, CCl$_2$F$_2$ | — | 5 | 3.8 | — | 1.4 | — |
| 8 | | 1.0 | O$_2$, CF$_4$ | — | 0.5 | — | — | — | 50 |
| 9 | | 1.0 | O$_2$, CF$_4$ | — | 1 | — | — | — | 70 |
| 10 | | 1.0 | O$_2$, CF$_4$ | — | 2 | — | — | — | 80 |
| 11 | | 1.0 | O$_2$, CF$_4$ | — | 5 | — | — | — | 10 |
| 12 | | 1.0 | O$_2$, CF$_4$ | — | 10 | — | — | — | 0 |

It is noted from Table 5 that in the case of low-pressure plasma treatment (Comparative Examples 8 to 12), the area of rubber rupture increases in proportion to the treating time (in the range of from 0.5 to 2 minutes), whereas it decreases when the treating time exceeds 2 minutes. This leads to poor adhesion. In addition, the area of rubber rupture does not reach 100% even in the case of treatment for 2 minutes which should give the highest value of rubber rupture. By contrast, in the case of atmospheric pressure plasma treatment (Examples 19 to 23), the treatment for 0.5 minute is enough for the rubber rupture to reach 100%. Prolonged treating time does not affect the adhesion properties. The conceivable reason for this is as follows: In the case of low-pressure glow plasma treatment, the rubber is exposed to a plasma atmosphere for a long time under reduced pressure, and consequently the rubber gets hot and gives off a gas which prevents the surface treatment. By contrast, in the case of atmospheric pressure plasma treatment, the rubber is not placed in an atmosphere under reduced pressure, and consequently the rubber does not give off a gas which prevents the stable surface treatment.

What is claimed is:

1. An apparatus for treatment of an object, comprising:
   an insulating vessel in which an object to be treated is placed;
   a plasma generator, connected to the insulating vessel including:
      a gas inlet on said insulating vessel;
      an electric source; and
      electrodes mounted to said insulating vessel and connected to the electric source; and
   means for rolling the object which is in the insulating vessel such that a surface of the objected is uniformly treated by plasma from the plasma generator as the object rolls in the insulating vessel.

2. An apparatus according to claim 1, wherein:
   said plasma generator is an atmospheric plasma generator.

3. An apparatus according to claim 2, wherein:
   said electrodes comprise voltage application electrodes and grounding electrodes, both of which are mounted on the outside of the insulating vessel.

4. An apparatus according to claim 2, wherein:
   said electrodes comprise electrodes which are mounted on the outside of the insulating vessel and electrodes which are mounted on the inside of the insulating vessel.

5. An apparatus according to claim 4, wherein:
   said outside electrodes comprise voltage application electrodes; and
   said inside electrodes comprise grounding electrodes.

6. An apparatus according to claim 4, wherein:
   said outside electrodes comprise grounding electrodes; and
   said inside electrodes comprise voltage application electrodes.

7. An apparatus according to claim 1, wherein:
   said plasma generator is an atmospheric glow plasma generator.

8. An apparatus according to claim 1, wherein:
   said electrodes comprise two arched outer electrodes which are mounted to opposite sides of said insulating vessel.

9. An apparatus according to claim 1, wherein:
   said electrodes comprise a plurality of annular outer electrodes which surround said insulating vessel, at least one of said plurality of annular electrodes being a voltage application electrode and at least another of said annular electrodes being a grounding electrode.

10. An apparatus according to claim 1, wherein:
    said electrodes comprise two electrodes which are spirally wound around said insulating vessel.

11. An apparatus according to claim 1, wherein said electrodes comprise:
    an arched outer electrode; and
    an arched inner electrode mounted to a side of the insulating vessel which is opposite to a side of the insulating vessel to which the arched outer electrode is mounted.

12. An apparatus according to claim 1, wherein said electrodes comprise:
    two arched outer electrodes which are arranged on opposite sides of said insulating vessel; and
    two inner arched electrodes which are arranged opposite to each other;
    wherein the outer and inner electrodes are shifted 90° with respect to each other.

13. An apparatus according to claim 1, wherein:
    said electrodes comprise three elongated outer electrodes arranged at regular intervals and three elongated inner electrodes arranged at regular intervals.

14. An apparatus according to claim 1, wherein: said electrodes comprise nine elongated outer electrodes arranged at regular intervals and nine elongated inner electrodes arranged at regular intervals.

15. An apparatus according to claim 1, wherein: said electrodes comprise a cylindrical outer electrode surrounding said insulating vessel and an elongated inner electrode arranged at a center portion of said insulating vessel.

16. An apparatus according to claim 1, wherein: said electrodes comprise a cylindrical outer electrode and three elongated inner electrodes arranged at regular intervals.

17. An apparatus according to claim 1, wherein: said electrodes comprise an elongated outer electrode spirally wound around said insulating vessel and an elongated inner electrode arranged at a center portion of said insulating vessel.

18. An apparatus according to claim 1, wherein said electrodes comprise a plurality of annular electrodes and an elongated inner electrode arranged at a center portion of said insulating vessel.

19. An apparatus according to claim 1, wherein said electrodes comprise a cylindrical outer electrode and at least two elongated inner electrodes arranged such that a golf ball can roll on said at least two elongated inner electrodes at a same time.

20. An apparatus according to claim 1, wherein: said electrodes comprise a cylindrical outer electrode and five elongated inner electrodes arranged at regular intervals.

21. An apparatus according to claim 1, wherein said electrodes comprise:
a plurality of outer annular electrodes and a plurality of inner annular electrodes wherein the outer annular electrodes and the inner annular electrodes are alternated along a length of said insulating vessel.

22. An apparatus according to claim 1, wherein said electrodes comprise:
a plurality of oblique outer annular electrodes and a plurality of oblique inner annular electrodes wherein the oblique outer annular electrodes and the oblique inner annular electrodes are alternated along a length of said insulating vessel.

23. An apparatus for treatment of an object, comprising:
an insulating vessel in which an object to be treated is placed;
a plasma generator, connected to the insulating vessel including:
a gas inlet on said insulating vessel;
an electric source; and
electrodes mounted to said insulating vessel and connected to the electric source; and
means for floating the object which is in the insulating vessel such that a surface of the objected is uniformly treated by plasma from the plasma generator as the object floats in the insulating vessel.

24. An apparatus according to claim 23, wherein: said means for floating floats the object using a fluid.

25. An apparatus according to claim 23, wherein: said means for floating floats the object using a gas from said gas inlet.

26. An apparatus according to claim 25, wherein: said plasma generator is an atmospheric plasma generator.

27. An apparatus according to claim 25, wherein: said electrodes comprise electrodes which are mounted on the outside of the insulating vessel and electrodes which are mounted on the inside of the insulating vessel.

28. An apparatus according to claim 27, wherein: said outside electrodes comprise voltage application electrodes; and
said inside electrodes comprise grounding electrodes.

29. An apparatus according to claim 27, wherein: said outside electrodes comprise grounding electrodes; and
said inside electrodes comprise voltage application electrodes.

30. An apparatus according to claim 25, wherein: said plasma generator is an atmospheric glow plasma generator.

31. An apparatus according to claim 25, wherein the object to be treated is spherical and said means for floating comprises a cylindrical tube, a diameter of which is approximately equal to a diameter of the spherical object to be treated.

32. An apparatus according to claim 23, wherein: said electrodes comprise two arched outer electrodes which are mounted to opposite sides of said insulating vessel.

33. An apparatus according to claim 23, wherein: said electrodes comprise a plurality of annular outer electrodes which surround said insulating vessel, at least one of said plurality of annular electrodes being a voltage application electrode and at least another of said annular electrodes being a grounding electrode.

34. An apparatus according to claim 23, wherein: said electrodes comprise two electrodes which are spirally wound around said insulating vessel.

35. An apparatus according to claim 23, wherein said electrodes comprise:
an arched outer electrode; and
an arched inner electrode mounted to a side of the insulating vessel which is opposite to a side of the insulating vessel to which the arched outer electrode is mounted.

36. An apparatus according to claim 23, wherein said electrodes comprise:
two arched outer electrodes which are arranged on opposite sides of said insulating vessel; and
two inner arched electrodes which are arranged opposite to each other;
wherein the outer and inner electrodes are shifted 90° with respect to each other.

37. An apparatus according to claim 23, wherein: said electrodes comprise three elongated outer electrodes arranged at regular intervals and three elongated inner electrodes arranged at regular intervals.

38. An apparatus according to claim 23, wherein: said electrodes comprise nine elongated outer electrodes arranged at regular intervals and nine elongated inner electrodes arranged at regular intervals.

39. An apparatus according to claim 23, wherein: said electrodes comprise a cylindrical outer electrode surrounding said insulating vessel and an elongated inner electrode arranged at a center portion of said insulating vessel.

40. An apparatus according to claim 23, wherein:
said electrodes comprise a cylindrical outer electrode and three elongated inner electrodes arranged at regular intervals.

41. An apparatus according to claim 23, wherein:
said electrodes comprise an elongated outer electrode spirally wound around said insulating vessel and an elongated inner electrode arranged at a center portion of said insulating vessel.

42. An apparatus according to claim 23, wherein said electrodes comprise a plurality of annular electrodes and an elongated inner electrode arranged at a center portion of said insulating vessel.

43. An apparatus according to claim 23, wherein said electrodes comprise a cylindrical outer electrode and two elongated inner electrodes arranged such that a golf ball can roll on said at least two elongated inner electrodes at a same time.

44. An apparatus according to claim 23, wherein:
said electrodes comprise a cylindrical outer electrode and five elongated inner electrodes arranged at regular intervals.

45. An apparatus according to claim 23, wherein said electrodes comprise:
a plurality of outer annular electrodes and a plurality of inner annular electrodes wherein the outer annular electrodes and the inner annular electrodes are alternated along a length of said insulating vessel.

46. An apparatus according to claim 23, wherein said electrodes comprise:
a plurality of oblique outer annular electrodes and a plurality of oblique inner annular electrodes wherein the oblique outer annular electrodes and the oblique inner annular electrodes are alternated along a length of said insulating vessel.

* * * * *